United States Patent
Ho

(10) Patent No.: US 9,325,155 B2
(45) Date of Patent: Apr. 26, 2016

(54) LIGHTNING PROTECTION APPARATUS

(71) Applicant: JJS COMMUNICATIONS CO., LTD., Taipei (TW)

(72) Inventor: Tsung-Hsin Ho, Taipei (TW)

(73) Assignee: JJS COMMUNICATIONS CO., LTD., Taipei (TW)

( * ) Notice: Subject to any disclaimer, the term of this patent is extended or adjusted under 35 U.S.C. 154(b) by 150 days.

(21) Appl. No.: 14/462,125

(22) Filed: Aug. 18, 2014

(65) Prior Publication Data

US 2016/0006218 A1 Jan. 7, 2016

(30) Foreign Application Priority Data

Jul. 4, 2014 (TW) ................ 103211982 U

(51) Int. Cl.
*H02H 1/00* (2006.01)
*H01T 4/10* (2006.01)
*H02H 9/06* (2006.01)
*H01T 4/02* (2006.01)
*H05K 1/02* (2006.01)
*H01T 4/08* (2006.01)

(52) U.S. Cl.
CPC .. *H01T 4/10* (2013.01); *H01T 4/02* (2013.01); *H02H 9/06* (2013.01); *H05K 1/026* (2013.01); *H01T 4/08* (2013.01)

(58) Field of Classification Search
USPC ........................ 361/91.1, 117–120
See application file for complete search history.

(56) References Cited

U.S. PATENT DOCUMENTS

2006/0002047 A1\* 1/2006 Cheung ............... H01T 21/00
361/118
2011/0211289 A1\* 9/2011 Kosowsky .......... H01L 27/0288
361/91.1

\* cited by examiner

*Primary Examiner* — Danny Nguyen
(74) *Attorney, Agent, or Firm* — WPAT, P.C., Intellectual Property Attorneys; Anthony King

(57) ABSTRACT

A lightning protection apparatus is provided, including a substrate and multiple passive elements, where multiple paired first electrical contacts and multiple paired second electrical contacts are disposed on the surface of the substrate, each pair of first electrical contacts is disposed to form a gap with an adjacent pair of second electrical contacts, and the passive element is separately coupled between each pair of the first electrical contacts and each pair of the second electrical contacts, so that a discharging gap is formed between a passive element on a pair of the first electrical contacts and a passive element on a pair of the second electrical contacts adjacent to the pair of the first electric contacts.

6 Claims, 4 Drawing Sheets

LIGHTNING PROTECTION APPARATUS

BACKGROUND

1. Technical Field

The present invention relates to a lightning protection apparatus, and in particular to a lightning protection apparatus, in which a passive element is separately disposed on each pair of first electrical contacts and each pair of second electrical contacts that are adjacent to each other, so as to form a discharging gap between the passive elements.

2. Related Art

The most common lightning protection method of a conventional circuit board is disposing two adjacent zigzag copper foils on a circuit board, and therefore, when a dropout voltage of a zigzag metal plate is excessively large, a point discharging phenomenon is generated between two opposite zigzag points through the air, to drain a voltage impulse. However, the foregoing discharging effect may be affected by the environment and an oxidation situation of the copper foils, and after discharging, the circuit board is easy to be burned and needs to be changed.

In physics, it can be known that the capacitance is defined as that a potential difference V between two conductors separately charged by +Q and −Q in space is in direct proportion to a charge Q, and a proportional constant Q/V is referred to as capacitance C between the two conductors. For a parallel-plate capacitor, it can be known that an arithmetic expression is $C=\epsilon_0 A/d$ (A is the area of a parallel plate, and d is an interval between parallel plates).

Accordingly, to eliminate the disadvantages of the foregoing lightning protection structure of a circuit board, the principle of the foregoing parallel-plate capacitor may be applied to a circuit board of a low pass filter, so as to improve the number of times for the circuit board being struck by lightning and prolong the service life of the circuit board. The present invention is made by the inventor through years of experience and continuous research, development and improvement.

SUMMARY

A primary objective of the present invention is to provide a lightning protection apparatus, in which paired first electrical contacts and paired second electrical contacts are disposed adjacently at input ports of a substrate, and a passive element is separately disposed on each pair of the first electrical contacts and each pair of the second electrical contacts, so that a discharging gap is formed between the passive elements adjacent to each other; therefore, when the substrate is struck by lightning, metal welding points of the adjacent passive elements are used to discharge in the discharging gap, so as to effectively prevent lightning.

A secondary objective of the present invention is to provide a lightning protection apparatus, where a guide hole passing through the substrate is separately disposed on each of the first electrical contacts and the second electrical contacts, and a metal layer is further disposed on the inner wall of the guide hole, so as to improve the tolerance for the substrate when the substrate is struck by lightning.

To achieve the foregoing objective, the lightning protection apparatus provided in the present invention includes a substrate and multiple passive elements, where the substrate is superficially provided with multiple paired first electrical contacts and multiple paired second electrical contacts, each pair of first electrical contacts is disposed to form a gap with an adjacent pair of second electrical contacts, and the passive element is separately coupled between each pair of the first electrical contacts and each pair of the second electrical contacts, so that a discharging gap is formed between a passive element on a pair of the first electrical contacts and a passive element on a pair of the second electrical contacts that is adjacent to the pair of the first electric contacts.

In implementation, a first electrical contact in each pair of the first electrical contacts is arranged in parallel with a second electrical contact adjacent to the first electrical contact.

In implementation, the passive element is a resistor or a capacitor.

In implementation, a guide hole passing through the substrate is separately disposed on the first electrical contacts and the second electrical contacts.

In implementation, a metal layer is further disposed on the inner wall of the guide hole.

In implementation, the substrate is a radio-frequency circuit substrate, and the paired first electrical contacts and the paired second electrical contacts are separately disposed at input ports of the radio-frequency circuit substrate.

In order to make the present invention more comprehensible, features and effects of the present invention are described in detail below through preferred embodiments with reference to the drawings and drawing numbers.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
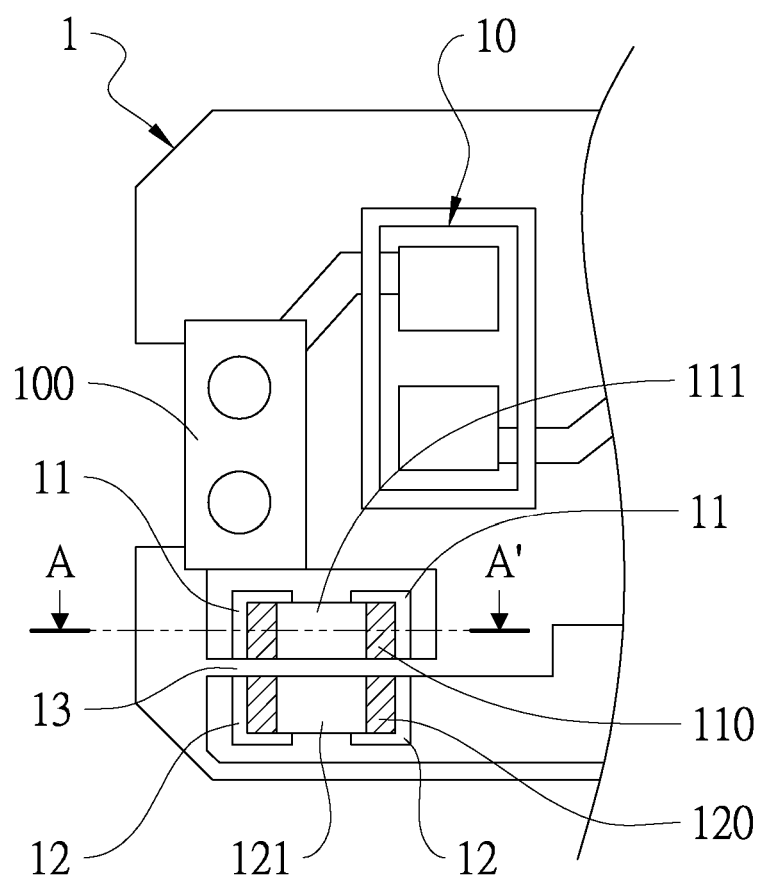
FIG. 1 is a schematic structural outside view of a part of a first embodiment of the present invention.
Figure 2:
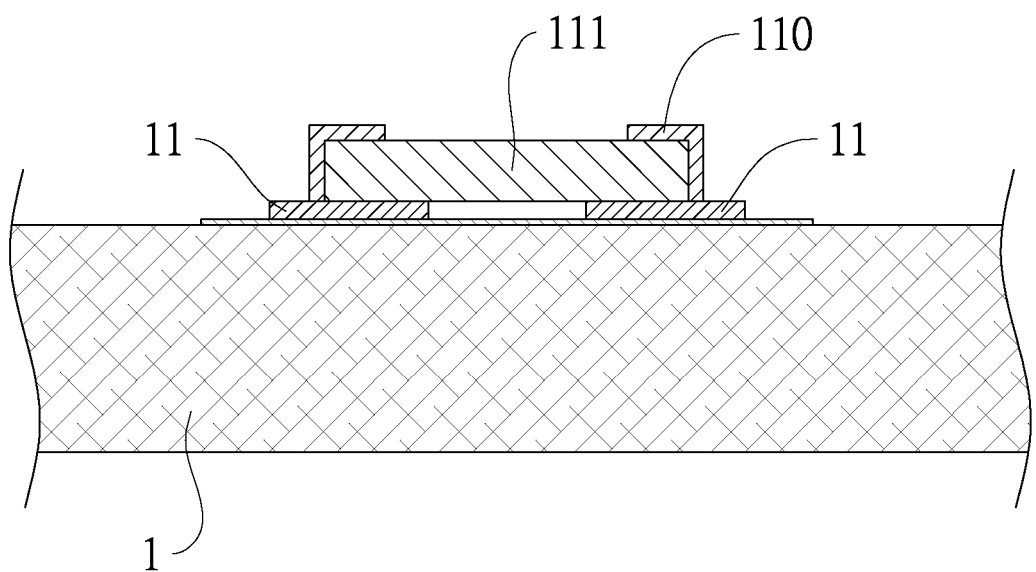
FIG. 2 is a schematic sectional diagram along a section line A-A' in the embodiment in FIG. 1.

FIG. 1 and FIG. 2 show a first embodiment of a lightning protection apparatus according to the present invention; and the lightning protection apparatus includes a substrate 1, multiple paired first electrical contacts 11 and multiple paired second electrical contacts 12, all of which are disposed on the surface the substrate 1, and multiple passive elements (111, 121), where the substrate 1 is a radio-frequency circuit substrate.

The paired first electrical contacts 11 and the paired second electrical contacts 12 are separately disposed at an input end 100 adjacent to a circuit 10 on the substrate 1, and are electrically connected to the input end 100 of the circuit 10. Each pair of the first electrical contacts 11 is disposed to form a certain gap width with an adjacent pair of the second electrical contacts 12, and a first electrical contact 11 in each pair of the first electrical contacts 11 is arranged in parallel with a second electrical contact 12 adjacent to the first electrical contact 11. The gap width is a distance which can make the passive elements (111, 121) to discharge through a gap, and is the width ranging from 0.1 mm to 0.2 mm preferably, or the shortest distance conforming to usage requirements.

The passive element (111, 121) may be a resistor or a capacitor, and is separately coupled between each of the pair of the first electrical contacts 11 and the pair of the second electrical contacts 12 in a welding manner, so that two ends of each passive element (111, 121) separately form a metal welding point (110, 120) on each of the first electrical contact 11 and the second electrical contact 12, so as to form a discharging gap 13 between the passive element 111 on the pair of the first electrical contacts 11 and the passive element 121 on the pair of the second electrical contacts 12 that is adjacent to the pair of the first electrical contacts 11.

Therefore, when the substrate 13 is struck by lightning to generate a voltage impulse, the voltage impulse is conducted to the pair of the first electrical contacts 11 and the passive element 111 connected on the pair of the first electrical contacts 11, so that the pair of the first electrical contacts 11 has high voltage potential compared with the pair of the second electric contacts 12; moreover, the metal welding points (110, 120) discharge through a discharging gap 13 between the passive element 111 on the first electrical contact 11 and the passive element 121 on the second electrical contact 12 adjacent to the first electrical contacts 11, preventing a large amount of impulse energy from entering a downstream circuit 10, thereby preventing the downstream circuit 10 from being damaged by the voltage impulse.

Figure 3:
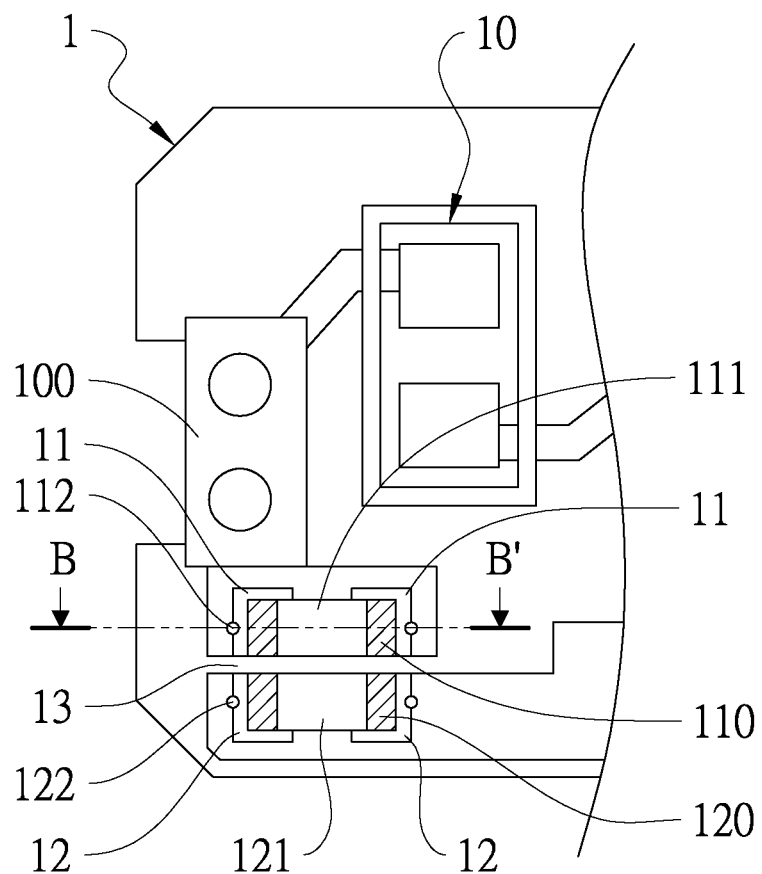
FIG. 3 is a schematic structural outside view of a part of a second embodiment of the present invention.
Figure 4:
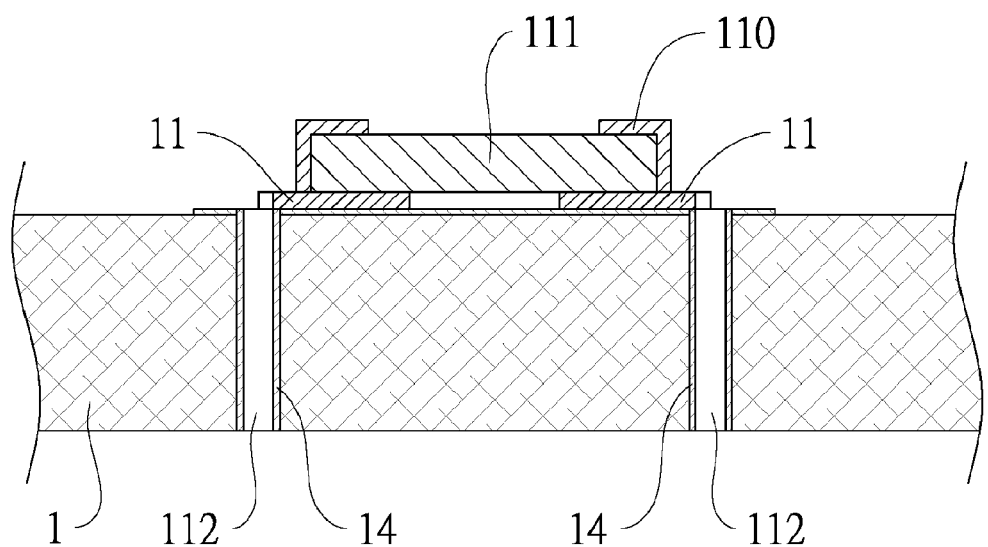
FIG. 4 is a schematic sectional diagram along a section line A-A' in the embodiment in FIG. 3.

FIG. 3 and FIG. 4 show a second embodiment of a lightning protection apparatus according to the present invention, and the lightning protection apparatus is based on the structure of the first embodiment. A guide hole (112, 122) passing through the substrate is separately disposed on each of the first electrical contacts 11 and the second electrical contacts 12, and a metal layer 14 which can be electrically connected to the first electrical contact 11 or the second electrical contact 12 is further disposed on the inner wall of each guide hole (112, 122), so that the tolerance of the electrical contacts (11, 12) and the passive elements (111, 121) against the voltage impulse is improved when the electrical contacts (11, 12) and the passive elements (111, 121) are struck by lightning, and the area of the substrate affected by discharging is reduced when a discharging phenomenon occurs in the discharging gap 13.

To sum up, according to the aforementioned disclosure, the present invention surely can achieve the expected objectives to provide a lightning protection apparatus which can improve the protective capability of a voltage impulse effectively and dramatically, and prevent electrical characteristics (a return loss and an insertion loss) of a circuit on a substrate from being seriously affected after the lightning protection apparatus is struck by lightning for several times, and has a great industrial applicability; thus, the application for a utility model is filed according to the law.

What is claimed is:

1. A lightning protection apparatus, comprising:
   a substrate, provided with multiple paired first electrical contacts and multiple paired second electrical contacts, all of which are disposed on the surface of the substrate, wherein each pair of first electrical contacts is disposed to form a gap with an adjacent pair of second electrical contacts; and
   multiple passive elements, separately welded between each pair of the first electrical contacts and each pair of the second electrical contacts, wherein a metal welding point is separately formed at two ends of each passive element, so as to form a discharging gap between a passive element on the pair of the first electrical contacts and a passive element on the pair of the second electrical contacts, so that metal welding points of adjacent passive elements discharge in the discharge gap.

2. The lightning protection apparatus according to claim 1, wherein a first electrical contact of each pair of the first electrical contacts is arranged in parallel with a second electrical contact adjacent to the first electrical contact.

3. The lightning protection apparatus according to claim 1, wherein the passive element is a resistor or a capacitor.

4. The lightning protection apparatus according to claim 1, wherein a guide hole passing through the substrate is separately disposed on each of the first electrical contacts and the second electrical contacts.

5. The lightning protection apparatus according to claim 4, wherein a metal layer is further disposed on the inner wall of the guide hole.

6. The lightning protection apparatus according to claim 1, wherein the substrate is a radio-frequency circuit substrate, and the paired first electrical contacts and the paired second electrical contacts are separately disposed at an input end of the radio-frequency circuit substrate.

* * * * *